US012598815B2

(12) United States Patent
Mizannojehdehi

(10) Patent No.: US 12,598,815 B2
(45) Date of Patent: Apr. 7, 2026

(54) CURRENT SENSE CIRCUIT WITH ELECTROSTATIC DISCHARGE PROTECTION

(71) Applicant: Infineon Technologies Canada Inc., Ottawa (CA)

(72) Inventor: Ahmad Mizannojehdehi, Stittsville (CA)

(73) Assignee: Infineon Technologies Canada Inc., Ottawa (CA)

( * ) Notice: Subject to any disclaimer, the term of this patent is extended or adjusted under 35 U.S.C. 154(b) by 115 days.

(21) Appl. No.: 18/496,579

(22) Filed: Oct. 27, 2023

(65) Prior Publication Data

US 2025/0142976 A1    May 1, 2025

(51) Int. Cl.
*G01R 19/00*        (2006.01)
*H10D 89/60*        (2025.01)

(52) U.S. Cl.
CPC ....... *H10D 89/911* (2025.01); *G01R 19/0092* (2013.01); *H10D 89/811* (2025.01)

(58) Field of Classification Search
CPC ............. G01R 19/0092; H10D 89/911; H10D 89/811; H03K 17/0822
See application file for complete search history.

(56) References Cited

U.S. PATENT DOCUMENTS 5,063,307 A * 11/1991 Zommer ................ H10D 89/60
                                                        327/512
5,903,422 A * 5/1999 Hosokawa ......... G01R 19/0092
                                                        327/543

2007/0229041 A1 * 10/2007 Oki ........................ H02H 3/087
                                                        323/266
2018/0351353 A1 * 12/2018 Mazoyer ................. H01L 23/62
2022/0271156 A1 * 8/2022 Peters .................. H10D 84/144
(Continued)

FOREIGN PATENT DOCUMENTS

DE        4207568 A1      9/1992
KR    102187903 B1    12/2020

OTHER PUBLICATIONS

Partial European Search Report received for application No. patent No. 24208704.7-1211 Feb. 1, 26, 2025, 12 pages.
(Continued)

*Primary Examiner* — Dominic E Hawkins
(74) *Attorney, Agent, or Firm* — WORKMAN NYDEGGER

(57)        ABSTRACT

A circuit that allows for accurate power transistor current sensing and electrostatic discharge protection. The circuit includes a power field-effect transistor and a sense field-effect transistor. The sense transistor current is proportional to (but much smaller than) the power transistor current. Thus, the power transistor current may be measured by measuring instead the sense transistor current. The gate nodes of the transistors are connected together, and the drain nodes of the transistors are connected together. However, the source nodes of the transistors are not directly connected to each other, and are instead connected together via a protective resistor. When the circuit is exposed to electrostatic discharge at the source of the sense transistor, the influx of charge that would have otherwise damaged the sense transistor is instead shared between both transistors via the protective resistor.

19 Claims, 2 Drawing Sheets

100

(56) References Cited

U.S. PATENT DOCUMENTS

| | | | |
|---|---|---|---|
| 2023/0019549 A1* | 1/2023 | Shilimkar | ........... H10D 64/254 |
| 2024/0297230 A1* | 9/2024 | Miremad | ............. H10D 62/343 |
| 2024/0364201 A1* | 10/2024 | Li | ...................... H02M 1/0009 |
| 2025/0020712 A1* | 1/2025 | Abdali Mashhadi | ........................ G01R 31/2644 |
| 2025/0038714 A1* | 1/2025 | Bouisse | .................. H03F 1/342 |

OTHER PUBLICATIONS

European Search Report received for application No. / patent No. 24208704.7-1211 / 4546649, on Jun. 1, 17, 2025, 12 pages.

* cited by examiner

100

CURRENT SENSE CIRCUIT WITH ELECTROSTATIC DISCHARGE PROTECTION

BACKGROUND

Electronic circuits typically include transistors, which function as electronic switches that regulate or control current flow in portions of the circuit. One type of transistor is a field-effect transistor in which a voltage is applied to a gate terminal to turn the transistor on and off. A semiconductor channel region is disposed between the drain terminal and the source terminal. When the transistor is on, current flows through the semiconductor channel region between the source terminal and the drain terminal. When the transistor is off, lesser or no current flows through the semiconductor channel region between the source terminal and the drain terminal. The gate terminal is disposed over the semiconductor channel region between the source terminal and the drain terminal. Voltage on the gate terminal generates a field that affects whether the semiconductor channel region conducts current-hence the term "field-effect transistor".

Nevertheless, there are other types of transistors. In each transistor, current flows from an input node to an output node through a channel when the transistor is "turned on" by applying a sufficient voltage to a control node. For instance, in a field-effect transistor, the control node would be the gate terminal, the input node would be one of the source or drain terminals, and the output node would be the other of the source or drain terminals.

Typical transistors are used for amplifying and switching purposes in electronic circuits. On the other hand, power transistors are used to convey more substantial current, have higher voltage ratings, and may more typically be used in power supplies, battery charging, and the like. Power transistors can typically operate with currents greater than 1 amp to as much as a hundred amps or even greater. Power transistors may convey power greater than 1 watt to as many as hundreds of watts or even greater. Nonetheless, measurement of current passing through a power transistor can be beneficial.

The subject matter claimed herein is not limited to embodiments that solve any disadvantages or that operate only in environments such as those described above. Rather, this background is only provided to illustrate one example technology area where some embodiments described herein may be practiced.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Embodiments described herein relate to a circuit that allows for accurate power transistor current sensing and electrostatic discharge protection. The circuit includes a power field-effect transistor (also referred to as the "power transistor") and a sense field-effect transistor (also referred to as the "sense transistor"). The current passing through the sense transistor is proportional to (but much smaller than) the current passing through the power transistor. Thus, the current passing through the power transistor may be measured by measuring instead the current passing through the sense transistor.

The power transistor has a gate node that controls whether current flows between a drain node and a source node of the power transistor. Likewise, the sense transistor has a gate node that controls whether current flows between a drain node and a source node of the sense transistor. The gate nodes of the power transistor and the sense transistor are connected together. Further, the drain nodes of the power transistor and the sense transistor are also connected together. However, the source nodes of the power transistor and the sense transistor are not directly connected to each other, and are instead connected together via a protective resistor, as will be explained later.

While the sense transistor allows for accurate sensing of the current through the power transistor, the small sense transistor may be more susceptible to damage from electrostatic discharge, particularly at the source node of the sense transistor. Electrostatic discharge can occur, for example, during manufacture when the circuit is being handled by a human, machinery, a testing probe, or other objects that may carry charge.

In order to protect the sense transistor from electrostatic discharge, the circuit includes the protective resistor placed between the source node of the sense transistor and the source node of the power transistor. Accordingly, when the circuit is exposed to electrostatic discharge at the source of the sense transistor, the large influx of charge that would have otherwise damaged the small sense transistor is instead shared between the sense transistor and the power transistor via the protective resistor.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the advantages and features of the circuits, systems, and methods described herein can be obtained, a more particular description of the embodiments briefly described herein will be rendered by reference to specific embodiments thereof which are illustrated in the appended drawings. Understanding that these drawings depict only typical embodiments of the circuits, systems and methods described herein, and are not therefore to be considered to be limiting of their scope, certain circuits, systems and methods will be described and explained with additional specificity and detail through the use of the accompanying drawings in which.

DETAILED DESCRIPTION

Embodiments described herein relate to a circuit that allows for accurate power transistor current sensing and electrostatic discharge protection. The circuit includes a power field-effect transistor (also referred to as the "power transistor") and a sense field-effect transistor (also referred to as the "sense transistor"). The current passing through the sense transistor is proportional to (but much smaller than) the current passing through the power transistor. Thus, the current passing through the power transistor may be measured by measuring instead the current passing through the sense transistor.

The power transistor has a gate node that controls whether current flows between a drain node and a source node of the power transistor. Likewise, the sense transistor has a gate node that controls whether current flows between a drain node and a source node of the sense transistor. The gate nodes of the power transistor and the sense transistor are connected together. Further, the drain nodes of the power transistor and the sense transistor are also connected together. However, the source nodes of the power transistor and the sense transistor are not directly connected to each other, and are instead connected together via a protective resistor, as will be explained later.

While the sense transistor allows for accurate sensing of the current through the power transistor, the small sense transistor may be more susceptible to damage from electrostatic discharge, particularly at the source node of the sense transistor. Electrostatic discharge can occur, for example, during manufacture when the circuit is being handled by a human, machinery, a testing probe, or other objects that may carry charge.

In order to protect the sense transistor from electrostatic discharge, the circuit includes the protective resistor placed between the source node of the sense transistor and the source node of the power transistor. Accordingly, when the circuit is exposed to electrostatic discharge at the source of the sense transistor, the large influx of charge that would have otherwise damaged the small sense transistor is instead shared between the sense transistor and the power transistor via the protective resistor.

Figure 1:
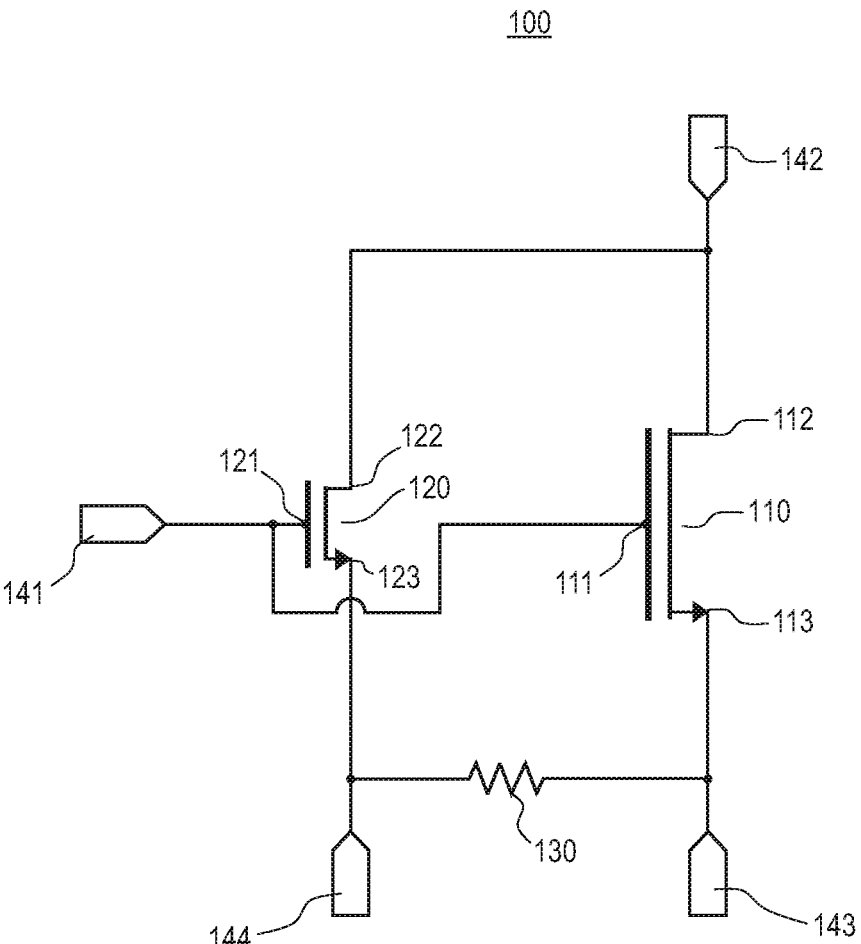
FIG. 1 illustrates a circuit in which the principles described herein may be practiced, and is just one example of a circuit that is consistent with the principles described herein.

FIG. 1 illustrates a circuit 100 in which the principles described herein may be practiced, and is just one example of a circuit that is consistent with the principles described herein. The circuit 100 is structured to allow for accurate power transistor current sensing and electrostatic discharge protection. The circuit 100 includes a power field-effect transistor 110, a sense field-effect transistor 120, and a protective resistor 130. However, for purposes of simplicity, the power field-effect transistor 110 may be referred to as the "power transistor 110", and the sense field-effect transistor 120 may be referred to as the "sense transistor 120". The principles described herein are not limited to the types of the power transistor and the sense transistor. However, in one very specific example, each of the power transistor 110 and the sense transistor 120 may be gallium-nitride field-effect transistors.

When the power transistor 110 and the sense transistor 120 are on, current passes through the power transistor 110 and the sense transistor 120. The sense transistor 120 may be, for example, a miniaturized replica of the power transistor 110. For instance, a ratio of a gate width of the power transistor 110 to a gate width of the sense transistor 120 may be 100 or more, or even a thousand or more, or even several thousand. Accordingly, the sense transistor 120 has an on-resistance that is larger than an on-resistance of the power transistor 110 by a factor of the ratio of the gate width of the power transistor 110 over the gate width of the sense transistor 120. Thus, the current passing through the sense transistor 120 is proportional to (but much smaller than) the current passing through the power transistor 110. Accordingly, the large current passing through the power transistor 110 may be ascertained by measuring instead the current passing through the sense transistor 120, and adjusting by the ratio between the gate width of the power transistor 110 over the gate width of the sense transistor 120.

The power transistor 110 includes a gate node 111 that controls whether current flows between a drain node 112 and a source node 113 of the power transistor 110. Likewise, the sense transistor 120 includes a gate node 121 that controls whether current flows between a drain node 122 and a source node 123 of the sense transistor 120. As an example, when a high voltage (e.g., positive 6 volts) is applied to the gate nodes 111 and 121, the respective transistors 110 and 120 turn on, whereas when a low voltage (e.g., zero volts) is applied to the gate nodes 111 and 121, the respective transistors 110 and 120 turn off.

The gate node 111 of the power transistor 110 and the gate node 121 of the sense transistor 120 are connected together. Further, the drain node 112 of the power transistor 110 and the drain node 122 of the sense transistor 120 are connected together. However, the source node 113 of the power transistor 110 and the source node 123 of the sense transistor 120 are not directly connected together. Instead, the protective resistor 130 is connected between the source node 113 of the power transistor 110 and the source node 123 of the sense transistor 120.

In this particular example, the gate nodes 111 and 121 are connected to an external gate terminal 141 to which gate voltages may be applied to control the on/off state of the transistors 110 and 120. Furthermore, the drain nodes 112 and 122 are connected to an external drain terminal 142 to which a drain voltage may be applied. For instance, in the case of transferring large amounts of power, the drain voltage may be quite high at least when the transistors 110 and 120 are off, perhaps even on the order of hundreds of volts. Likewise, the source node 113 of the power transistor 110 is connected to an external power source terminal 143 (e.g., ground). Finally, the source node 123 of the sense transistor 120 is connected to an external sense source terminal 144 that would carry a signal (e.g., a current signal or a voltage signal) from which the current passing through the power transistor 110 may be determined.

While the sense transistor 120 allows for accurate sensing of the current passing through the power transistor 110, the sense transistor 120 alone is susceptible to damage from electrostatic discharge (herein referred to as "ESD") that may be inadvertently applied to the external sense source terminal 144. As an example, in FIG. 1, suppose that the circuit 100 did not include the protective resistor 130. If ESD occurred at the external sense source terminal 144, then all of the influx of charge from the ESD would be sent to a very small gate-source capacitance of the sense transistor 120. In fact, the charge may be too much for the sense transistor 120 and may cause significant damage to the sense transistor 120.

To overcome this vulnerability of the sense transistor 120, the circuit 100 includes the protective resistor 130 connected between the source node 123 of the sense transistor 120 and the source node 113 of the power transistor 110. Thus, the influx of charge due to ESD at the external sense source terminal 144 is instead shared between the sense transistor 120 and the power transistor 110. The resistance value of the protective resistor 130 may be selected such that ESD protection for the source node 123 of the sense transistor 120 is achieved, but that accurate current sensing is still maintained. That is, if the resistance value of the protective resistor 130 was too large, current sensing would be highly accurate, but ESD protection would be decreased, as not enough of the influx of charge from ESD could flow to the source node 113 of the power transistor 110. On the other hand, if the resistance value of the protective resistor 130 was too small, ESD protection would be increased, but current sensing accuracy would be decreased, as the current passing through the transistors 110 and 120 would lose proportionality.

Accordingly, the resistance value of the protective resistor 130 may be chosen so as to achieve sufficient ESD protection, while maintaining sufficiently accurate current sensing. As an example, the product of the resistance value of the protective resistor 130 and the gate width of the sense transistor 120 may be greater than 10 ohm·mm (ohm millimeters). This may be the case, for example, if the gate width of the sense transistor 120 was 0.1 mm, and the resistance value of the protective resistor 130 was 100 ohms or more. As another example, the product of the resistance value of the protective resistor 130 and the gate width of the sense transistor 120 may be greater than 50 ohm·mm. This may be the case, for example, if the gate width of the sense transistor 120 was 0.1 mm, and the resistance value of the protective resistor 130 was 500 ohms or more.

In another non-limiting example, the resistance of the protective resistor 130 may be greater than an on-resistance of the sense transistor 120. Further, the resistance of the protective resistor 130 may be greater than twice, or even five times the on-resistance of the sense transistor 120. In any case, the principles described herein are not limited to the particular gate widths of any of the sense transistor 120 and the power transistor 110, are not limited to the on-resistances of the sense transistor 120 and the power transistor 110, and are not limited to the particular resistance value of the protective resistor 130.

As previously expressed, in order to achieve accurate current sensing, the sense transistor 120 may be a miniaturized replica of the power transistor 110. This may be the case, for example, if the power transistor 110 and the sense transistor 120 were manufactured on the same semiconductor substrate using portions of a same epitaxial stack epitaxially deposited on the semiconductor substrate.

Figure 2:
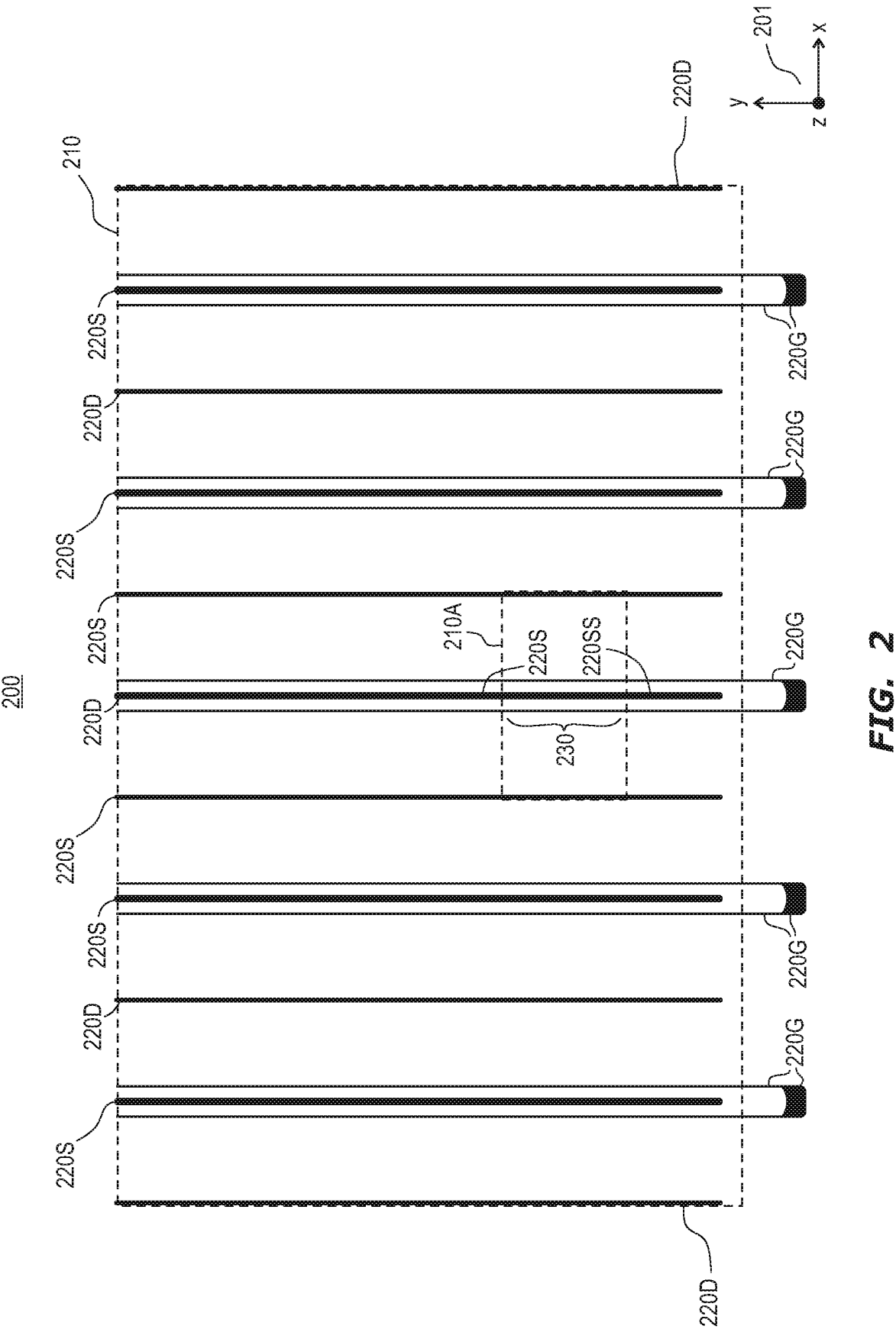
FIG. 2 illustrates a top view of a circuit in the form of an epitaxial stack deposited on a common semiconductor substrate, which represents an example of the circuit of FIG. 1.

FIG. 2 illustrates a top view of a circuit 200 in the form of an epitaxial stack deposited on a common semiconductor substrate. The top view is viewing downward opposite the direction of epitaxial growth of the epitaxial stack. For instance, FIG. 2 illustrates a coordinate system 201 in which the y-axis is vertical in the plane of the page, the x-axis is horizontal in the plane of the page, and the z-axis is perpendicular to the plane of the page. Epitaxial growth is in the positive z-direction, and the top view is viewing in the negative z-direction. The plane of the page is the x-y plane. The semiconductor substrate on which the epitaxial stack is grown is parallel to the x-y plane.

The circuit 200 may be an example of the circuit 100 of FIG. 1. The circuit 200 includes various an active region 210 that is everywhere except for within the window 210A where a resistor 230 is. The circuit also includes contact portions 220D, 220G, 220S, and 220SS (illustrated in solid-lined form and referred to collectively hereinafter as "contact portions 220"). The contact portions 220 are each elongated in the y-direction that is parallel to the y-axis and that is also parallel to the semiconductor substrate.

As an example, these active region 210 may be connected to gate nodes, drain nodes, and source nodes of the power transistor 110 and the sense transistor 120 of FIG. 1, via the contact portions 220. Specifically, the active region 210 may be connected to the connected drain nodes 112 and 122 of FIG. 1 via various drain contact portions 220D, and may be connected to connected gate nodes 111 and 121 of FIG. 1 via various gate contact portions 220G. However, the active region 210 may be connected to the source node 113 of the power transistor 110 via various power source contact portions 220S, and to the source node 123 of the sense transistor 120 via a sense source contact portion 220SS. The centermost power source contact portion 220S and the sense source contact portion 220SS may be colinear with each other.

The resistor 130 of FIG. 1 may also be represented epitaxially in FIG. 2, for example, in the form of a resistive portion 230 that is also colinear with both of the centermost power source contact portion 220S and the sense source contact portion 220SS. The resistive portion 230 may be formed epitaxially between the colinear power source contact portion 220S and the sense source contact portion 220SS, such that the power source contact portion 220S and the sense source contact portion 220SS are electrically connected with some amount of resistance therebetween. In one embodiment, the resistive portion 230 may be made of a same conductive material as, and have a same width as, the power source contact portion 220S and the sense source contact portion 220SS.

However, in another embodiment, the resistive portion 230 may be made of a different conductive material, and may have a different width (i.e., a cross-sectional thickness in the x-direction) than either of the power source contact portion 220S and the sense source contact portion 220SS. In fact, a resistive value of the resistive portion 230 may be selected by selecting a specific conductive material to use for the resistive portion 230, and by selecting a specific width (in the x-direction) for the resistive portion 230. For example, the resistance of the resistive portion 230 may be increased by selecting a conductive material with more inherent resistance, and/or by selecting a thinner conductive width for the resistive portion 230. On the other hand, the resistance of the resistive portion 230 may be decreased by selecting a conductive material with less inherent resistance, and/or by selecting a wider conductive width for the resistive portion 230.

Additionally, the resistance of the resistive portion 230 may be increased or decreased by respectively increasing or decreasing the distance in the y-direction between the sense source contact portion 220SS and the colinear power source contact portion 210S, and therefore respectively increasing or decreasing the length (in the y-direction) of the resistive portion 230. This may be accomplished, in part, by adjusting the distance in the y-direction of the window 210A in the active region 210. In any case, the principles described herein are not limited to the specific conductive material of the resistive portion 230, the conductive width of the resistive portion 230, the length of the resistive portion 230, and the particular distance between the sense source contact portion 220SS and the colinear power source contact portion 220S.

Accordingly, what has been described is a circuit that allows for 1) accurate current sensing of a large current passing through a power transistor via the use of a sense transistor, and 2) electrostatic discharge protection of the sense transistor via a protective resistor connected between the source node of the sense transistor and the source node of the power transistor.

Literal Support Section

Clause 1. A circuit comprising: a power field-effect transistor having a gate node that controls whether current flows from a drain node of the power field-effect transistor to a source node of the power field-effect transistor; a sense field-effect transistor having a gate node that controls whether current flows from a drain node of the sense field-effect transistor to a source node of the sense field-effect transistor, the gate node of the sense field-effect transistor being connected to the gate node of the power field-effect transistor, the drain node of the sense field-effect transistor being connected to the drain node of the power field-effect transistor; and a resistor connected between the source node of the sense field-effect transistor and the source node of the power field-effect transistor.

Clause 2. The circuit according to Clause 1, the resistance of the resistor being at least 500 ohms.

Clause 3. The circuit according to Clause 1, the resistance of the resistor being at least 100 ohms.

Clause 4. The circuit according to Clause 1, wherein the resistance of the resistor is greater than an on-resistance of the sense field-effect transistor.

Clause 5. The circuit according to Clause 1, wherein the resistance of the resistor is greater than twice an on-resistance of the sense field-effect transistor.

Clause 6. The circuit according to Clause 1, wherein the resistance of the resistor is greater than five times an on-resistance of the sense field-effect transistor.

Clause 7. The circuit according to Clause 1, the product of the resistance of the resistor and a gate width of the sense field-effect transistor is greater than 50 ohm·mm.

Clause 8. The circuit according to Clause 1, the product of the resistance of the resistor and a gate width of the sense field-effect transistor is greater than 10 ohm·mm.

Clause 9. The circuit according to Clause 1, wherein the power field-effect transistor and the sense field-effect transistor are manufactured on a semiconductor substrate using portions of a same epitaxial stack epitaxially deposited on the semiconductor substrate.

Clause 10. The circuit in accordance with Clause 9, the power field-effect transistor comprising a source contact portion that is elongated in a particular direction parallel to the semiconductor substrate, and that is connected to the source node of the power field-effect transistor; and the sense field-effect transistor comprising a source contact portion that is elongated in the particular direction and that is connected to the source node of the sense field-effect transistor, the source contact portion of the sense field-effect transistor being colinear with the source contact portion of the power field-effect transistor; wherein the resistor is a conductor that extends in the particular direction colinearly with the source contact portion of the power field-effect transistor and the source contact portion of the sense field-effect transistor to thereby electrically couple with a resistance the source contact portion of the of the power field-effect transistor and the source contact portion of the sense field-effect transistor.

Clause 11. The circuit according to Clause 1, wherein the power field-effect transistor and the sense field-effect transistor are each gallium-nitride field-effect transistors.

Clause 12. The circuit in accordance with Clause 1, a gate width of the power field-effect transistor being at least 100 times a gate width of the sense field-effect transistor.

Although the subject matter has been described in language specific to structural features and/or methodological acts, it is to be understood that the subject matter defined in the appended claims is not necessarily limited to the described features or acts described above, or the order of the acts described above. Rather, the described features and acts are disclosed as example forms of implementing the claims.

The present disclosure may be embodied in other specific forms without departing from its essential characteristics. The described embodiments are to be considered in all respects only as illustrative and not restrictive. All changes which come within the meaning and range of equivalency of the claims are to be embraced within their scope.

When introducing elements in the appended claims, the articles "a," "an," "the," and "said" are intended to mean there are one or more of the elements. The terms "comprising," "including," and "having" are intended to be inclusive and mean that there may be additional elements other than the listed elements.

What is claimed is:

1. A die comprising a circuit that comprises:
   a power field-effect transistor having a gate node that controls whether current flows from a drain node of the power field-effect transistor to a source node of the power field-effect transistor;
   a sense field-effect transistor having a gate node that controls whether current flows from a drain node of the sense field-effect transistor to a source node of the sense field-effect transistor, the source node further connected to an external source sense terminal of the die, the gate node of the sense field-effect transistor being connected to the gate node of the power field-effect transistor, the drain node of the sense field-effect transistor being connected to the drain node of the power field-effect transistor; and
   a resistor connected between the source node of the sense field-effect transistor and the source node of the power field-effect transistor, such that any electrostatic discharge externally applied to the external source sense terminal will be dissipated not only through the sense field-effect transistor, but via the resistor through the power field-effect transistor to provide electrostatic discharge protection to the sense field-effect transistor.

2. The die according to claim 1, the resistance of the resistor being at least 500 ohms.

3. The die according to claim 1, the resistance of the resistor being at least 100 ohms.

4. The die according to claim 1, wherein the resistance of the resistor is greater than an on-resistance of the sense field-effect transistor.

5. The die according to claim 1, wherein the resistance of the resistor is greater than twice an on-resistance of the sense field-effect transistor.

6. The die according to claim 1, wherein the resistance of the resistor is greater than five times an on-resistance of the sense field-effect transistor.

7. The die according to claim 1, the product of the resistance of the resistor and a gate width of the sense field-effect transistor is greater than 50 ohm·mm.

8. The die according to claim 1, the product of the resistance of the resistor and a gate width of the sense field-effect transistor is greater than 10 ohm·mm.

9. The die according to claim 1, wherein the power field-effect transistor and the sense field-effect transistor are manufactured on a semiconductor substrate using portions of a same epitaxial stack epitaxially deposited on the semiconductor substrate.

10. The die according to claim 1, wherein the power field-effect transistor and the sense field-effect transistor are each gallium-nitride field-effect transistors.

11. The die in accordance with claim 1, a gate width of the power field-effect transistor being at least 100 times a gate width of the sense field-effect transistor.

12. A circuit that comprises:

a power field-effect transistor having a gate node that controls whether current flows from a drain node of the power field-effect transistor to a source node of the power field-effect transistor;

a sense field-effect transistor having a gate node that controls whether current flows from a drain node of the sense field-effect transistor to a source node of the sense field-effect transistor, the gate node of the sense field-effect transistor being connected to the gate node of the power field-effect transistor, the drain node of the sense field-effect transistor being connected to the drain node of the power field-effect transistor, wherein the power field-effect transistor and the sense field-effect transistor are manufactured on a semiconductor substrate using portions of a same epitaxial stack epitaxially deposited on the semiconductor substrate; and a resistor connected between the source node of the sense field-effect transistor and the source node of the power field-effect transistor, the power field-effect transistor comprising a source contact portion that is elongated in a particular direction parallel to the semiconductor substrate, and that is connected to the source node of the power field-effect transistor; and the sense field-effect transistor comprising a source contact portion that is elongated in the particular direction and that is connected to the source node of the sense field-effect transistor, the source contact portion of the sense field-effect transistor being colinear with the source contact portion of the power field-effect transistor;

wherein the resistor is a conductor that extends in the particular direction colinearly with the source contact portion of the power field-effect transistor and the source contact portion of the sense field-effect transistor to thereby electrically couple with a resistance the source contact portion of the power field-effect transistor and the source contact portion of the sense field-effect transistor.

13. The circuit according to claim 12, the resistance of the resistor being at least 500 ohms.

14. The circuit according to claim 12, the resistance of the resistor being at least 100 ohms.

15. The circuit according to claim 12, wherein the resistance of the resistor is greater than an on-resistance of the sense field-effect transistor.

16. The circuit according to claim 12, wherein the resistance of the resistor is greater than twice an on-resistance of the sense field-effect transistor.

17. The circuit according to claim 12, wherein the resistance of the resistor is greater than five times an on-resistance of the sense field-effect transistor.

18. The circuit according to claim 12, the product of the resistance of the resistor and a gate width of the sense field-effect transistor is greater than 50 ohm·mm.

19. The circuit according to claim 12, the product of the resistance of the resistor and a gate width of the sense field-effect transistor is greater than 10 ohm·mm.

\* \* \* \* \*